United States Patent
Krula

(10) Patent No.: US 7,311,551 B1
(45) Date of Patent: Dec. 25, 2007

(54) WIRELESS COMMUNICATION DEVICE INCLUDING A SOCKET FOR A REMOVABLE MEMORY DEVICE AND METHOD OF USING THE SAME

(75) Inventor: David A. Krula, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/421,410

(22) Filed: May 31, 2006

(51) Int. Cl.
*H01R 13/60* (2006.01)
(52) U.S. Cl. .................... 439/541.5; 439/326; 439/157; 455/556.1
(58) Field of Classification Search ................ 439/326, 439/541.5, 157; 455/556.1
See application file for complete search history.

(56) References Cited

U.S. PATENT DOCUMENTS

| D349,730 S | * | 8/1994 | Fung ........................... D19/60 |
| 5,574,625 A | * | 11/1996 | Ohgami et al. ............. 361/684 |
| 5,933,328 A | * | 8/1999 | Wallace et al. ............. 361/737 |
| 5,979,771 A | * | 11/1999 | Adams et al. ............... 235/486 |
| D443,610 S | * | 6/2001 | Lo .............................. D14/334 |
| 6,651,881 B1 | * | 11/2003 | Choiset ....................... 235/380 |
| 6,824,413 B1 | | 11/2004 | Shipe et al. |
| 7,093,764 B1 | * | 8/2006 | Valenzuela et al. ......... 235/486 |
| 2003/0095194 A1 | * | 5/2003 | Suzuki et al. .......... 348/231.99 |

FOREIGN PATENT DOCUMENTS

| JP | 2001-351751 | 12/2001 |
| JP | 2003-282206 | 10/2003 |

* cited by examiner

*Primary Examiner*—Truc Nguyen

(57) ABSTRACT

A wireless communication device includes a housing including a front, a rear, a top, a bottom, a left side, and a right side, and a printed circuit board carried by the housing and carrying electronics for operation of the wireless communication device. The printed circuit board defines a plane, and a socket is disposed in the housing and connected to the circuit board. The socket is configured to allow substantially perpendicular receipt of a removable memory device relative to the plane defined by the printed circuit board, in a manner such that the socket defines a plane substantially perpendicular to the plane defined by the printed circuit board.

10 Claims, 3 Drawing Sheets

WIRELESS COMMUNICATION DEVICE INCLUDING A SOCKET FOR A REMOVABLE MEMORY DEVICE AND METHOD OF USING THE SAME

FIELD OF THE INVENTION

The present invention relates, in general, to handheld electronic devices utilizing a removable memory device, and, in particular, to handheld wireless communication devices utilizing a removable memory device.

BACKGROUND OF THE INVENTION

Handheld electronic devices such as wireless communication devices (e.g., cellular handsets) hold most of the device electronics on a printed circuit board (PCB). A constant need exists to reduce the size of the electronics and other PCB elements and to reduce the size of the PCB in an effort to make the handheld electronic devices smaller and more convenient to use. A problem with utilizing an external removable memory device with handheld electronic devices is that the socket that receives the external memory device takes up a large amount of space, making the handheld electronic device larger than desired.

SUMMARY OF THE INVENTION

An aspect of the present invention involves the use of a small profile component socket that allows substantially perpendicular insertion of the removable memory device relative to the PCB of the handheld electronic device. The small profile component socket allows the width and/or length of the PCB to be smaller and/or accommodate additional electronics/elements. This arrangement results in a smaller, more-compact handheld electronic device.

An additional aspect of the invention involves a wireless communication device. The wireless communication device includes a housing having a front, a rear, a top, a bottom, a left side, and a right side, and a printed circuit board carried by the housing and carrying electronics for operation of the wireless communication device. The printed circuit board defines a plane, and a socket is disposed in the housing and connected to the circuit board. The socket is configured to allow substantially perpendicular receipt of a removable memory device relative to the plane defined by the printed circuit board, in a manner such that the socket defines a plane substantially perpendicular to the plane defined by the printed circuit board.

Another aspect of the invention involves a method of using a removable memory device with a wireless communication device. Other features and advantages of the present invention will become more readily apparent to those of ordinary skill in the art after reviewing the following detailed description and accompanying drawings

DETAILED DESCRIPTION

Certain embodiments as disclosed herein provide for a wireless communication device and method of use including a small profile component socket that allows substantially perpendicular insertion of a removable memory device relative to a PCB of the wireless communication device.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention as set forth in the appended claims.

Figure 1:
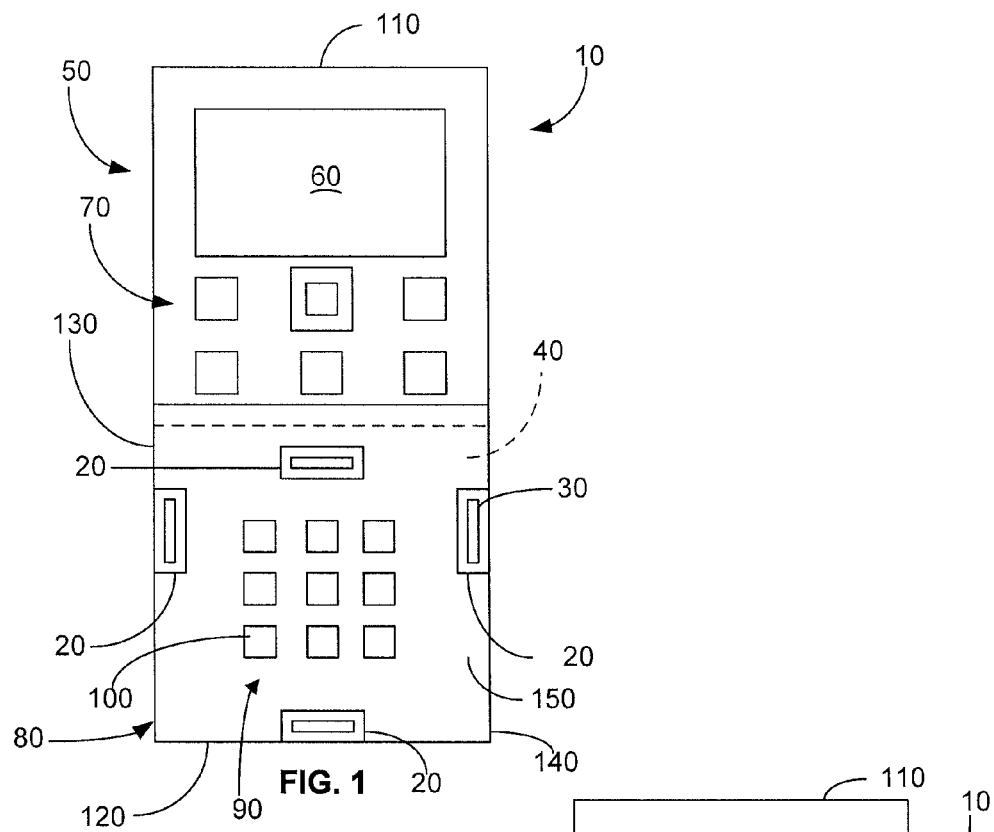
FIG. 1 is a simplified top plan view of a wireless communication device according to one embodiment.

FIG. 1 is a simplified top plan view of an embodiment of wireless communication device 10 including multiple small profile component sockets 20 that allow substantially perpendicular insertion of removable memory device 30 relative to PCB structure 40 of wireless communication device 10.

Wireless communication device 10 includes first housing member 50 having display 60 and input keys 70. Second housing member 80 includes PCB 40 and sockets 20. Second housing member 80 also includes keypad 90 with keys 100 in front 150 for entering phone numbers (and possibly other information). Wireless communication device 10 includes top 110, bottom 120, left side 130, right side 140, front 150, and rear (not shown). In the embodiment shown, first housing member 50 is slidable relative to second housing member 80 between a first position where first housing member 50 is in front of second housing member 80, protecting sockets 20 and removable memory device 30, and a second position where first housing member 50 and second housing member 80 are in the positions shown in FIG. 1 for normal operation of wireless communication device 10. Although not shown, in one or more embodiments, pivotal door(s) cover and protect socket(s) 20.

In alternative embodiments, wireless communication device 10 has different configurations such as, but not by way of limitation, a clam-shell configuration where first housing member 50 is pivotal relative to second housing member 80 and a candy-bar configuration where first housing member 50 is fixed relative to second housing member 80 (or first housing member 50 is integrated with second housing member 80 to form a single integrated housing member).

In further embodiments, device 10 is a handheld electronic device other than wireless communication device such as, but not limited to, a personal digital assistant (PDA) or other handheld computer.

PCB 40 carries electronics of wireless communication device 10 for operation of wireless communication device 10, and includes top 210, bottom 220, left side (not shown), right side 240, front 250, and rear 260. In alternative embodiments, the PCB 40 includes one or more a coprocessor, camera interface electronics, infrared communications, and hardware/software for performing a variety of functions.

Removable memory device 30 includes top 310, bottom 320, left side 330, right side 340, front 350, rear 360, length L, width W, and thickness T. An example removable memory device includes, but not by way of limitation, T-flash removable media. However, in alternative embodiments, other types of removable media are used.

With reference to FIG. 1, small profile sockets 20 are substantially perpendicularly disposed relative to PCB 40, allowing substantially perpendicular insertion of removable memory device 30 relative to PCB 40 of wireless communication device 10 (removable memory device 30 is inserted into and removed out of front 150 of wireless communication device 10, i.e., front insertion/removal). In an alternative embodiment, one or more small profile sockets 20 are on rear of wireless communication device 10 (removable memory device 30 is inserted into and removed out of rear of wireless communication device 10, i.e., rear insertion/removal).

Figure 3:
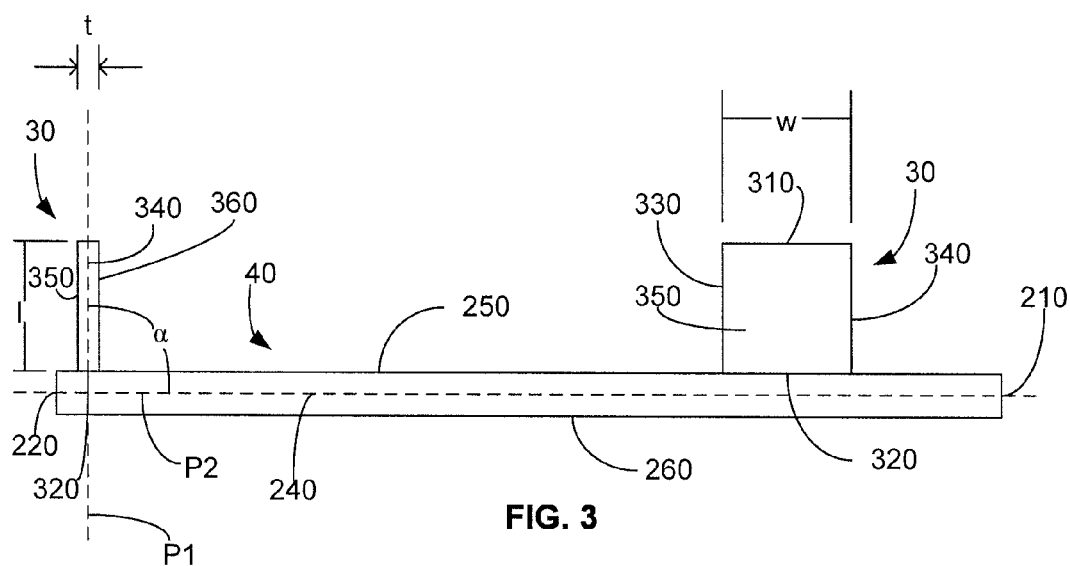
FIG. 3 is a simplified right side-elevational view of an embodiment of a socket mounting option on a PCB.

As used herein, "perpendicular" means that plane P1 defined by removable memory device 30 (and socket 20) as shown in FIG. 3 and plane P2 defined by removable PCB 40 are disposed at an angle α equal to 90 degrees (α=90°). As used herein, "substantially perpendicular" means that plane P1 defined by removable memory device 30 (and socket 20) and plane P2 defined by removable PCB 40 are disposed at an angle α greater than 45 degrees and less than or equal to 90 degrees ($45°<α≦90°$).

When removable memory device 30 is fully disposed in socket 20, removable memory device 30 is substantially perpendicularly disposed relative to PCB 40, as shown in FIG. 3. The leading face upon insertion (e.g., bottom 320) of the removable memory device 30 has a small/smallest area (e.g., narrow/narrowest width and/or short/shortest length) of all the faces (e.g., front 350, rear 360, etc.) and is substantially parallel with PCB 40.

Socket(s) 20 include springs and mechanical locking/unlocking mechanisms (not shown) to retain removable memory device(s) 30 in a fully inserted locked position, substantially perpendicular to PCB 40 as shown in FIGS. 3 and/or 4, and to unlock/deploy removable memory device(s) 30 from socket(s) 20.

Figure 2:
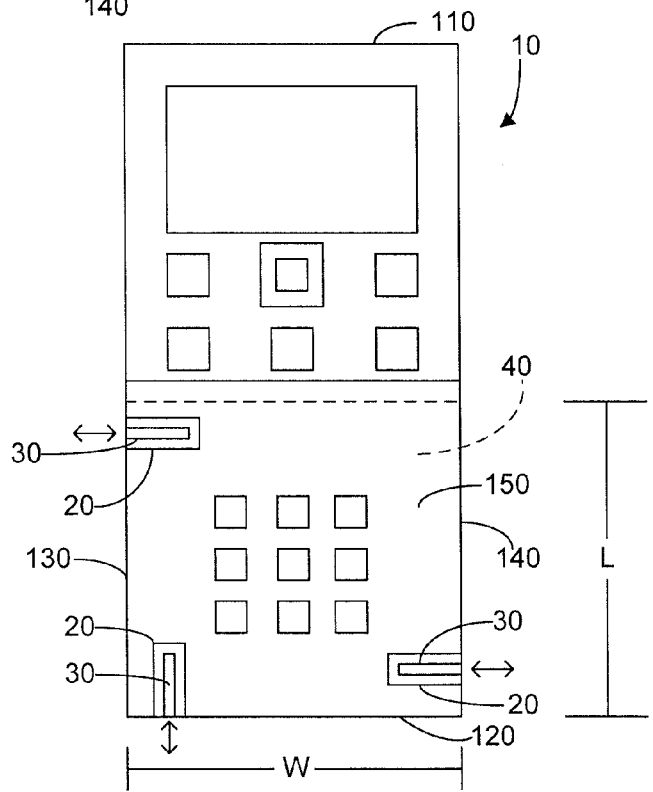
FIG. 2 is a simplified top plan view of a wireless communication device according to another embodiment.

With reference to FIG. 2, in an alternative embodiment, sockets 20 are open to one of more of left side 130, right side 140, bottom 120, and top 110 to allow removable memory device 30 to be inserted laterally or vertically (left and right, up and down) into and out of left side 130, right side 140, bottom 120, and/or top 110 of wireless communication device 10 in the direction shown by the arrows (i.e., side/end insertion/removal). In this embodiment, small profile component sockets 20 are also substantially perpendicularly disposed relative to PCB 40 and allow substantially perpendicular insertion of removable memory device 30 relative to PCB 40 of wireless communication device 10. Similar to the embodiment of sockets 20 described above with respect to FIG. 1, socket(s) 20 of FIG. 2 include springs and mechanical locking/unlocking mechanisms to retain removable memory device(s) 30 in a fully inserted locked position, substantially perpendicular to PCB 40 as shown in FIGS. 3 and/or 4, and to unlock/deploy removable memory device(s) 30 from socket(s) 20. Although the sockets 20 illustrated in FIG. 2 are shown as being open at front 150, in an alternative embodiment, socket(s) 20 are not open at front 150. In the fully inserted position, the face of the removable memory device 30 opposing PCB 40 (e.g., bottom 320) has a small/smallest area (e.g., narrow/narrowest width and/or short/shortest length) of all the faces (e.g., front 350, rear 360, etc.) and is substantially parallel with PCB 40.

Although four sockets 20 are shown in the embodiments of FIGS. 1 and 2, in alternative embodiments, one, two, three, or other numbers of sockets 20 are used. In further embodiments, wireless communication device 10 includes a combination of socket types and/or locations described herein.

Figure 5:
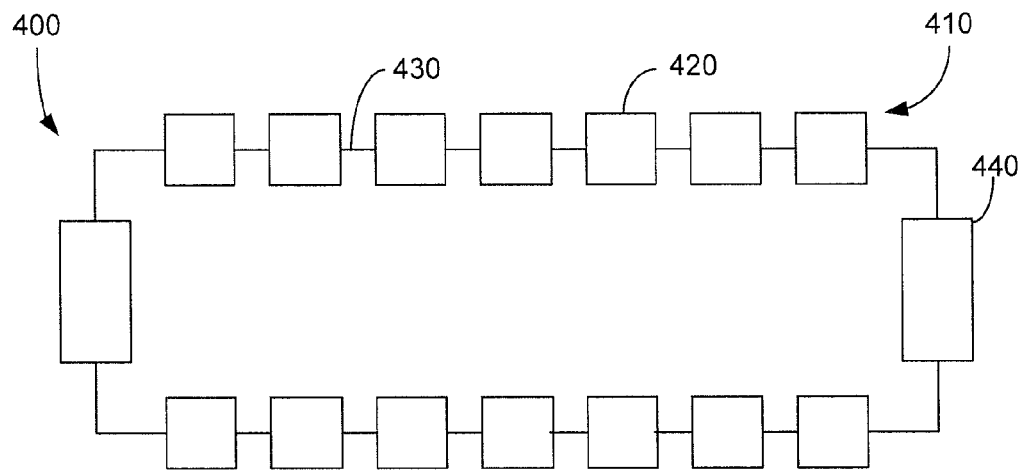
FIG. 5 is a simplified top plan view of an embodiment of a socket-to-PCB connection.

With reference to FIGS. 3 and 5, an embodiment of a socket and PCB connection assembly 400 that allows for a reduction in the length and/or width of PCB 40 will be described. Assembly 400 is a front-mounted connection assembly in which socket 20 is mounted on front 250 of PCB 40. In this embodiment, connections 410 for socket 20 are on front 250 of PCB 40. Assembly 400 includes electrical connections 420 and electrical connection paths 430 for electrically communicating socket 20 and removable memory device 30 with PCB 40. Assembly 400 includes mechanical connections 440 for mechanically connecting socket 20 to PCB 40.

Figure 4:
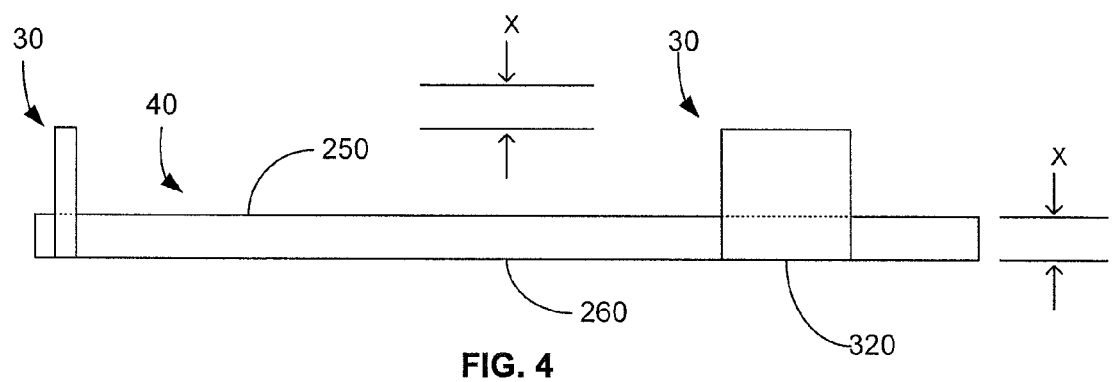
FIG. 4 is a simplified right side-elevational view of another embodiment of a socket mounting option on a PCB.
Figure 6:
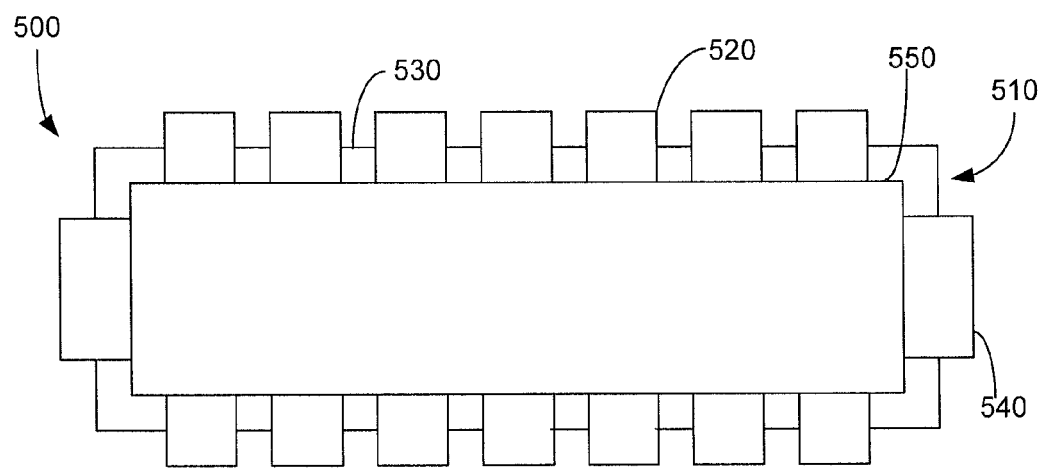
FIG. 6 is a simplified top plan view of another embodiment of a socket-to-PCB connection.

With reference to FIGS. 4 and 6, an embodiment of a socket and PCB connection assembly 500 that has a thinner profile (socket and PCB connection assembly 500 has a thickness that is a distance X thinner than socket and PCB connection assembly 400 of FIG. 3) and allows for a reduction in the length and/or width of PCB 40 will be described. Assembly 500 is mounted through PCB 40 with connections 510 for socket 20 on rear 260 (for front-loading) or front 250 (for rear-loading) of the PCB 40. Assembly 500 includes electrical connections 520 and electrical connection paths 530 for electrically communicating socket 20 and removable memory device 30 with PCB 40. Assembly 500 includes mechanical connections 540 for mechanically connecting socket 20 to PCB 40 and hole 550 for socket insertion within PCB 40. Thus, assembly 500 allows a thinner profile and allows for a reduction in length L and/or width W of PCB 40. As a result, wireless communication device 10 has a thinner profile and a smaller length and/or width than was available in the past where removable memory devices were used with wireless communication devices.

The wireless communication device 10 will now be described in use. With reference to FIG. 1, in this embodiment of wireless communication device 10 and socket(s) 20, front insertion/removal of memory device(s) 30 occurs. To add removable memory device(s) 30, removable memory device(s) 30 are inserted into socket(s) 20, through front 150 of wireless communication device 10, to a fully inserted, locked position. The mechanical locking/unlocking mechanism of each socket 20 retains removable memory device 30 in a fully inserted locked position, substantially perpendicular to PCB 40 as shown in FIGS. 3 and/or 4. To remove each memory device 30, the mechanical locking/unlocking mechanism of socket 20 is actuated, causing the spring(s) to at least partially deploy removable memory device 30 from socket 20. With the removable memory device 30 partially deployed out of socket 20, the removable memory device 30 is engaged by the fingers of a user and removed from wireless communication device 10 by pulling away from front 150 of wireless communication device 10.

With reference to FIG. 2, in this embodiment of wireless communication device 10 and socket(s) 20, side/bottom insertion and removal of memory devices 30 occurs. To add removable memory devices 30, removable memory devices 30 are inserted into sockets 20, through left side 130, right side 140 and bottom 30, to a fully inserted, locked position. In an alternative embodiment, wireless communication device 10 includes one or more sockets 20 adjacent top 110 so that memory device 30 is insertable/removable through top 110. The mechanical locking/unlocking mechanism of each socket 20 retains removable memory device 30 in a fully inserted locked position, substantially perpendicular to PCB 40 as shown in FIGS. 3 and/or 4. To remove each memory device 30, the mechanical locking/unlocking mechanism of socket 20 is actuated, causing the spring(s) to at least partially deploy removable memory device 30 from socket 20. With the removable memory device 30 partially deployed out of socket 20, the removable memory device 30 is engaged by the fingers of a user and removed from wireless communication device 10 by pulling to the left/right, down, depending on the location of socket 20, relative to wireless communication device 10.

Orienting socket(s) 20 and removable memory device(s) 30 substantially perpendicularly relative to PCB 40 allows for a reduction in length L and/or width W of PCB 40, and/or allows for more room on PCB 40 for other components. The small thickness t of removable memory device 30 takes up a small amount of length L and/or width W of PCB 40, allowing PCB 40 to have a smaller length L and/or width W. As a result, wireless communication device 10 has a smaller length and/or width than was available in the past where removable memory devices were used with wireless communication devices. Having socket(s) 20 extend into PCB 40, as shown in FIG. 4, allows wireless communication device 10 to have a thinner profile. Socket(s) 20 that allow front insertion of the removable memory device(s) 30, as shown in FIG. 1, are mechanically safer sockets because the closing of first housing member 50 on second housing member 80, when wireless communication device 10 is not in use, protects socket(s) 20 and/or removable memory device(s) 30.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A wireless communication device comprising:
   a housing including a front, a rear, a top, a bottom, a left side, and a right side;
   a printed circuit board carried by the housing and carrying electronics for operation of the wireless communication device, the printed circuit board defining a plane; and
   a socket disposed in the housing and connected to the circuit board, the socket configured to allow substantially perpendicular receipt of a removable memory device relative to the plane defined by the printed circuit board, the socket defining a plane substantially perpendicular to the plane defined by the printed circuit board.

2. The wireless communication device of claim 1, wherein the socket is openable along the front of the housing to allow front insertion of the removable memory device.

3. The wireless communication device of claim 1, wherein the socket is openable along the rear of the housing to allow rear insertion of the removable memory device.

4. The wireless communication device of claim 1, wherein the socket is openable along the top of the housing to allow top insertion of the removable memory device.

5. The wireless communication device of claim 1, wherein the socket is openable along the bottom of the housing to allow bottom insertion of the removable memory device.

6. The wireless communication device of claim 1, wherein the socket is openable along the left side of the housing to allow left side insertion of the removable memory device.

7. The wireless communication device of claim 1, wherein the socket is openable along the right side of the housing to allow right side insertion of the removable memory device.

8. The wireless communication device of claim 1, wherein the printed circuit board includes a front, and further including a front-mounted connection assembly that connects the socket to the front of the printed circuit board.

9. The wireless communication device of claim 1, wherein the printed circuit board includes a rear, and further including a rear-mounted connection assembly that connects the socket to the rear of the printed circuit board.

10. The wireless communication device of claim 1, wherein the socket is at least partially disposed in the printed circuit board.

* * * * *